(12) United States Patent
Li

(10) Patent No.: US 6,383,841 B2
(45) Date of Patent: *May 7, 2002

(54) METHOD FOR ENCAPSULATING WITH A FIXING MEMBER TO SECURE AN ELECTRONIC DEVICE

(75) Inventor: Allen Li, Taoyuan Shien (TW)

(73) Assignee: Delta Electronics, Inc., Taoyuan Shien (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/157,458

(22) Filed: Sep. 21, 1998

(30) Foreign Application Priority Data

Mar. 12, 1998 (TW) .......................................... 87103686

(51) Int. Cl.⁷ ............................................... H01L 21/48
(52) U.S. Cl. ...................... 438/112; 438/121; 438/123; 438/124; 438/126; 438/127
(58) Field of Search ................................ 438/124, 127, 438/112, 123, 126, 106, 121; 257/790, 787; 29/827, 841, 849, 855, 856

(56) References Cited

U.S. PATENT DOCUMENTS

| 4,163,072 A | * | 7/1979 | Soos .......................... 438/112 |
| 5,641,997 A | * | 6/1997 | Ohta et al. .................. 257/790 |
| 5,729,050 A | * | 3/1998 | Kim ............................ 257/790 |
| 5,793,118 A | * | 8/1998 | Nakajima .................... 257/790 |
| 5,889,232 A | * | 3/1999 | Ichikawa et al. ........... 174/52.2 |
| 5,904,955 A | * | 5/1999 | Goldstein et al. ........... 438/112 |

FOREIGN PATENT DOCUMENTS

| JP | 3-82059 | * | 4/1991 |
| JP | 4-92459 | * | 3/1992 |
| JP | 4-165634 | * | 6/1992 |

* cited by examiner

Primary Examiner—Olik Chaudhuri
Assistant Examiner—Alonzo Chambliss
(74) Attorney, Agent, or Firm—Michael Best & Friedrich LLC; J. Warren Whitesel

(57) ABSTRACT

The present invention is to provide a effective method for packing an electronic device including steps of: (a) putting an electronic device having a plurality of pins in a frame having a plurality of connecting members corresponding to said plurality of pins; (b) electrically connecting the plurality of pins of the electronic device with the corresponding connecting members; (c) mounting a fixing member on the electronic device to fix the electronic device with respect to the frame to form a semi-product; and (d) packing the semi-product with the fixing member.

6 Claims, 6 Drawing Sheets

METHOD FOR ENCAPSULATING WITH A FIXING MEMBER TO SECURE AN ELECTRONIC DEVICE

FIELD OF THE INVENTION

The present invention relates to a method for packing electronic device.

BACKGROUND OF THE INVENTION

The packing structure of electronic device are genarally classified into two type as follows:

1. Chip

FIG. 1 shows that the chip (10) having a plurality of connectors is put on a support (111) of a frame (11) having a plurality of connecting pins (112) corresponding to the plurality of connectors. The connecting member (112) are electrically connected to the plurality of pins by a plurality of metal wires (13). Then, a filling medium (14) is applied on the chip (10) or between the chip (10) and the frame (11) to form a semi-product. Finally, the semi-product is packed and hardened by a plastic molding process to form a product.

2. General electronic device

As shown in FIG. 2a and FIG. 2b, the traditional electronic device having a circuit (20) (including a printed circuit board (PCB) or not) is electrically connected to the plurality of connecting members of a frame (21) through a plurality of metal wires (23). Consequently, a filling medium (24) is applied on the surface of the electronic device (20) or between the electronic device and the connecting members (212) to form a semi-product. The semi-product is further packed by a plastic molding process to form product.

However, the methods of traditional packing electronic device still have some disavantages as following:

1. The semi-product must be precisely fixed in the center of packing structure. If not, it will cause the semi-product to be exposed during the packing process.
2. During the plastic molding process, the filling medium must be evenly distributed in the mold in order to prevent an excess of the filling medium in one side of the mold. Otherwise, the semi-product will be shifted and exposed.

Therefore, the present invention provides a method for improving the above-described.

SUMMARY OF THE INVENTION

The present inventions provide an effective method for packing the electronic devices by using a fixing member to avoid an impact in packing process.

An object of the present invention is to provide a practical method for packing an electronic device. The method includes the steps of (a) putting an electronic device having a plurality of pins in a frame having a plurality of connecting members corresponding to the plurality of pins, (b) electrically connecting the plurality of pins of the electronic device with the corresponding connecting members, (c) mounting a fixing member on the frame to fix the electronic device with respect to the frame to form a semi-product, and (d) packing the semi-product with the fixing member.

In accordance with an aspect of the present invention, the electronic device includes a chip or a functional block having circuits thereon.

In accordance with another aspect of the present invention, in the step (b), the plurality of pins are electrically connected to the corresponding connecting members by welding wires between the pins and the corresponding connecting members.

In accordance with another aspect of the present invention, the step (b) further includes a step of (b1) applying a filling medium between the electronic device and the frame.

In accordance with another aspect of the present invention, the step (c) further includes a step of (c1) mounting another fixing member under the electronic device.

In accordance with another aspect of the present invention in the step (c), the fixing member is an adhering piece made of a molding material.

In accordance with another aspect of the present invention, the step (d) further includes : (d1) providing a mold enveloping the electronic device and the fixing member; (d2) filling a packing medium into the mold; and (d3) curing the fixing member and the packing medium.

The present invention may best be understood through the following description with reference to the accompanying drawings, in which:

BRIEF DESCRIPTION OF THE DRAWINGS

FIG. 2b is a side view of a packing structure in FIG. 2a;

FIG. 3b is a side view of a packing structure shown in FIG. 3a;

DETAILED DESCRIPTION OF THE PREFERRED EMBODIMENTS

Figure 1:
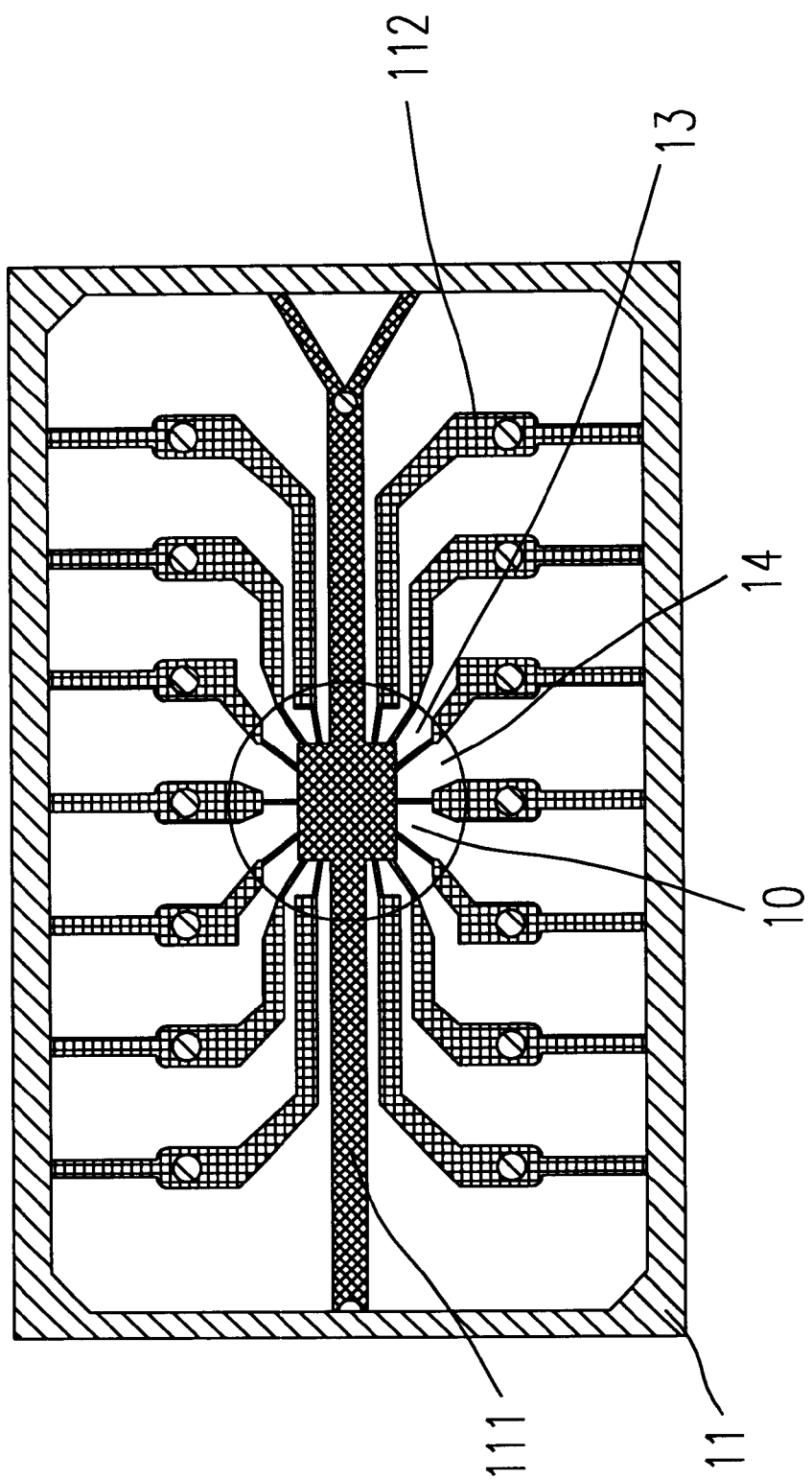
FIG. 1 shows a structure for packing a chip according to prior art.
Figure 2A:
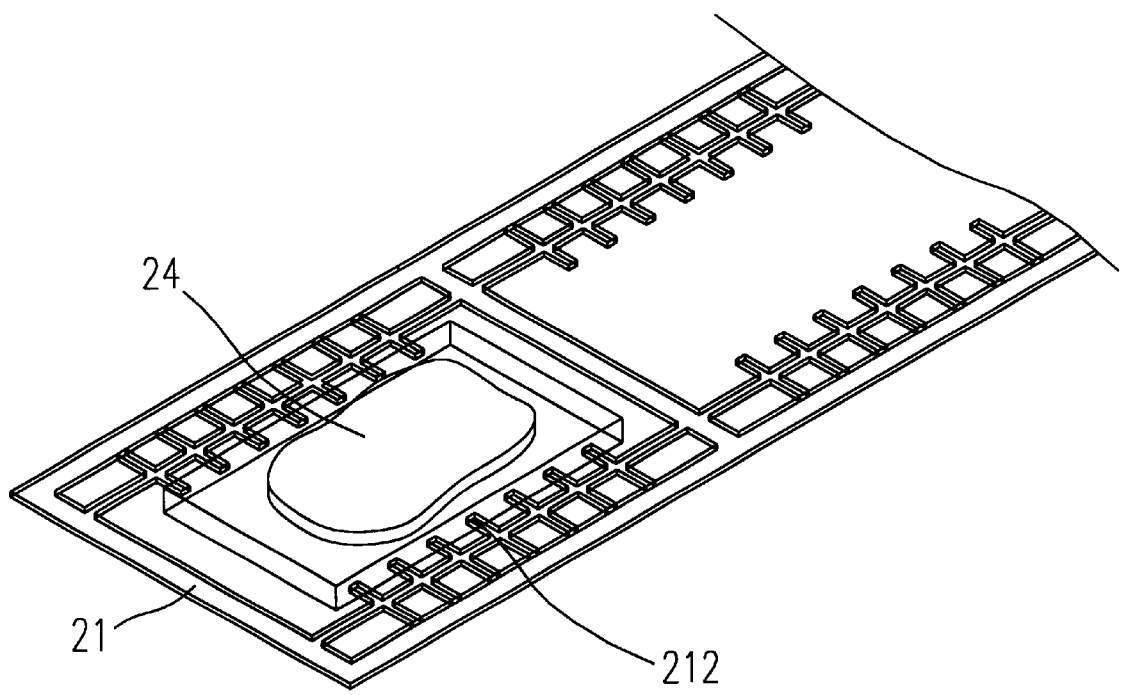
FIG. 2a shows a structure for packing an electronic device according to prior art.
Figure 2B:
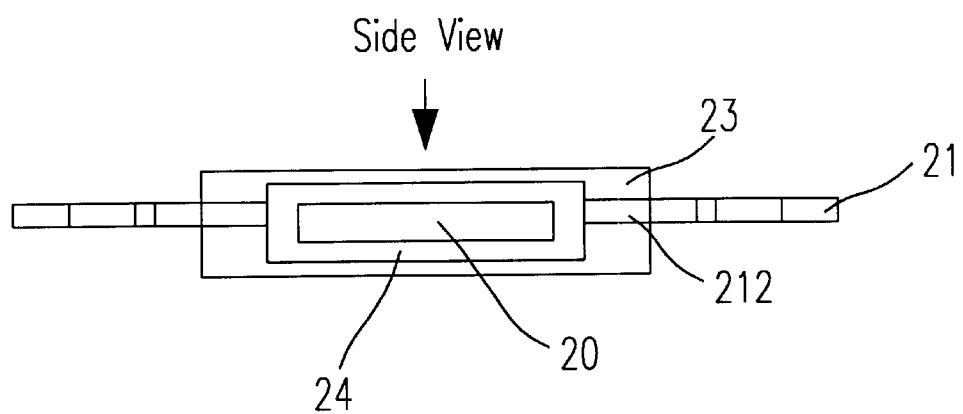
Figure 3A:
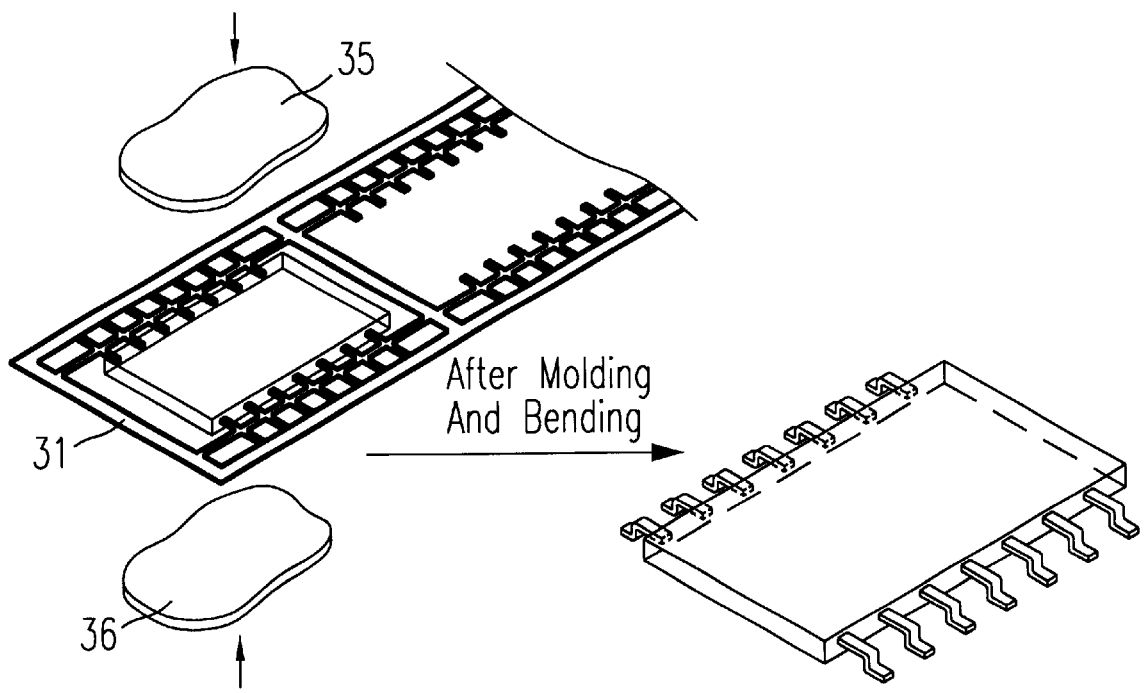
FIG. 3a shows a preferred embodiment of a method for packing electronic device according to the present invention.
Figure 3B:
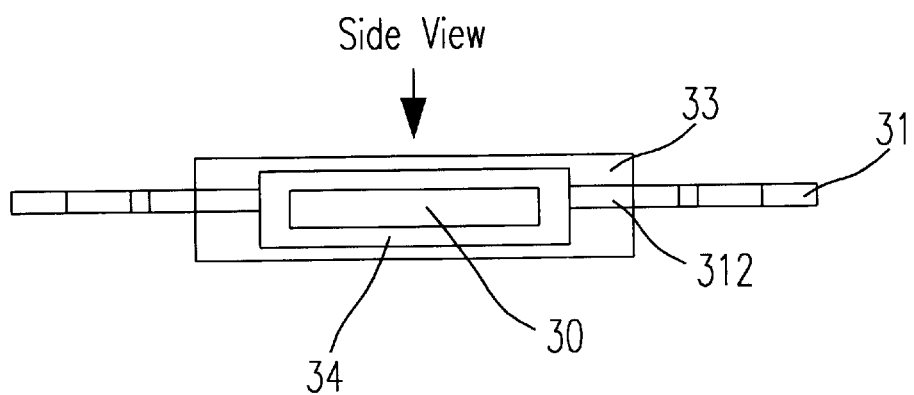
Figure 5:
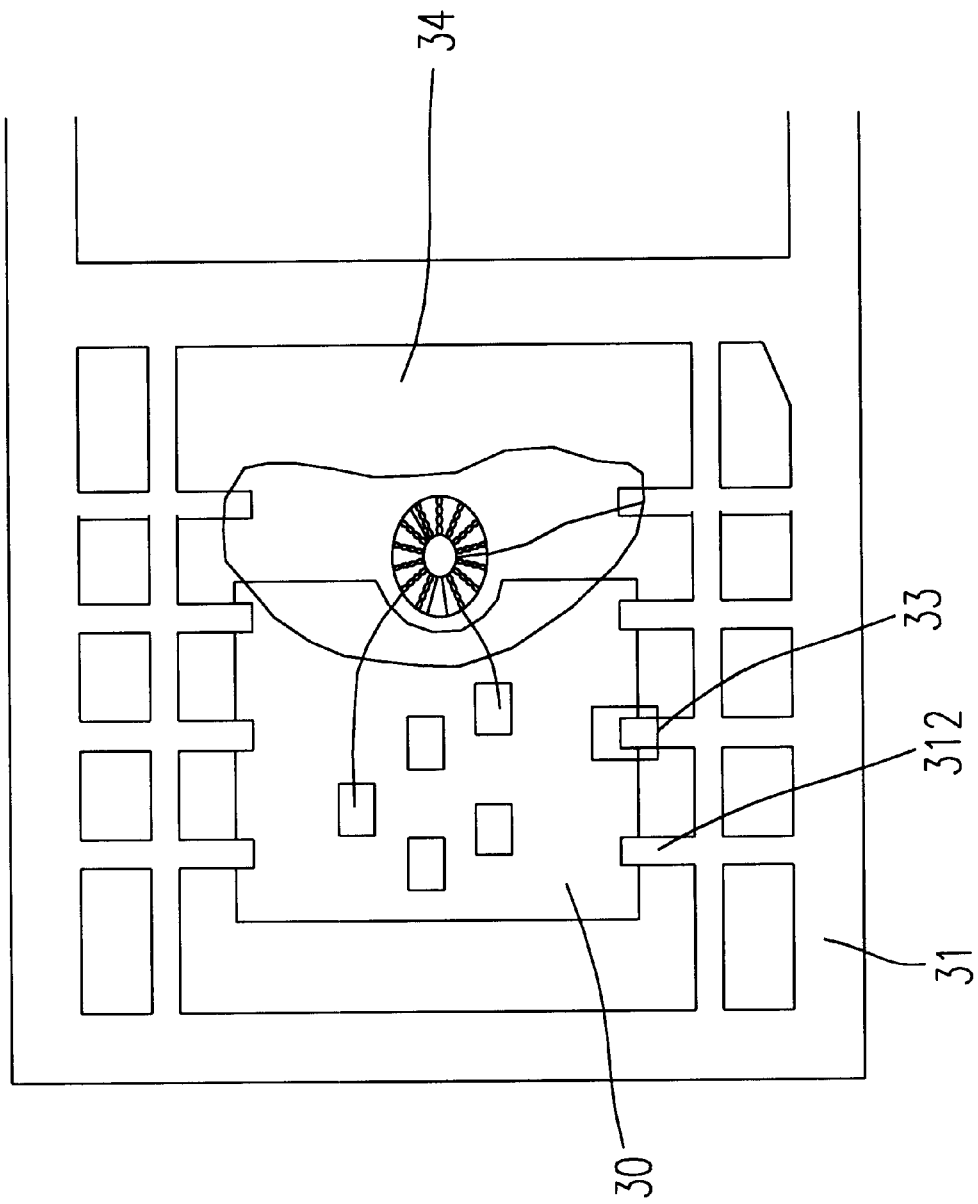
FIG. 5 shows a structure of an electronic circuit with the printed circuit board (PCB)
Figure 6:
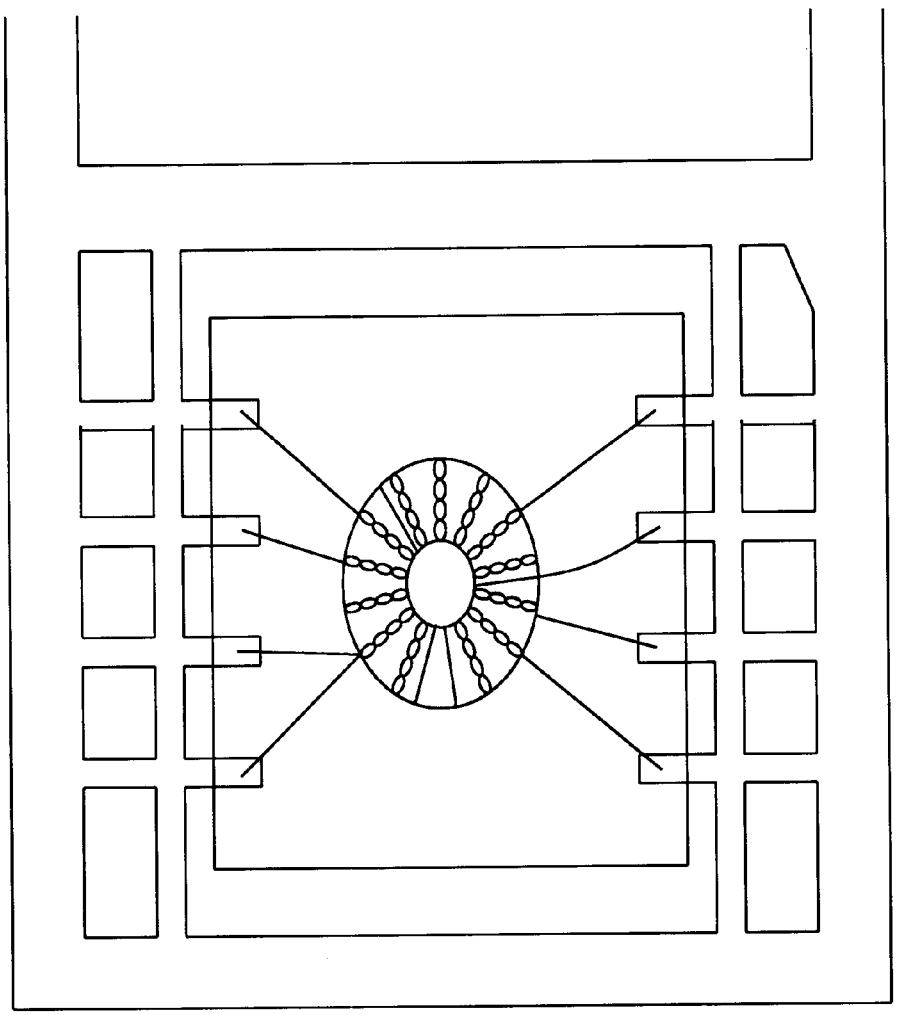
FIG. 6 shows a structure of an electronic circuit having a functional block.

FIG. 3a and FIG. 3b show the first preferable embodiment of present invention for packing an electronic device. Firstly, an electronic device having a circuit (30) is put in a frame (31). FIG. 5 shows the electronic device has a circuit structure in printed circuit board (PCB). FIG. 6 shows an electronic device with a functional block which does not include PCB. A plurality of metal wires (33) was used to make an electrical connection between a plurality of pins in the electronic device (30) and a plurality of corresponding connecting members (312) in the frame (31). Then, a filling medium (34) is applied between the electronic device (31) and connecting members (312) to fix the electronic device in the center of the frame (31) to form a semi-product. The above described method is the same as the prior art. Two fixing members (35), (36) are respectively attached to the top and bottom surface of the semi-product to fix the semi-product. Finally, a plastic molding process is performed to pack the semi-product. The process includes following steps as: providing a mold enveloping the electronic device and the fixing member, filling a packing medium into the mold, and curing the fixing member and the packing medium.

The fixing member is an adhering piece made of a molding material. The fixing members (35), (36) can protect the semi-product from an impact in the plastic molding. The impact often causes an exposure of the semi-product or the breakage of the electrical contact wires. So, according to the present invention, the semi-product is not so required to be precisely positioned like the prior art. In addition, the flux design of the mold can also be simplified. Therefore, the present invention can greatly reduce the design cost and the manufacturing cost. The fixing member can effectively fix the semi-product and protect the semi-product from being impacted. It is unnecessary to allow the semi-product to have a lot of safely moving space. Thus, the package of the electronic device can be minimized. This method will greatly simplify the packing process and reduce the cost of production.

Figure 4A:
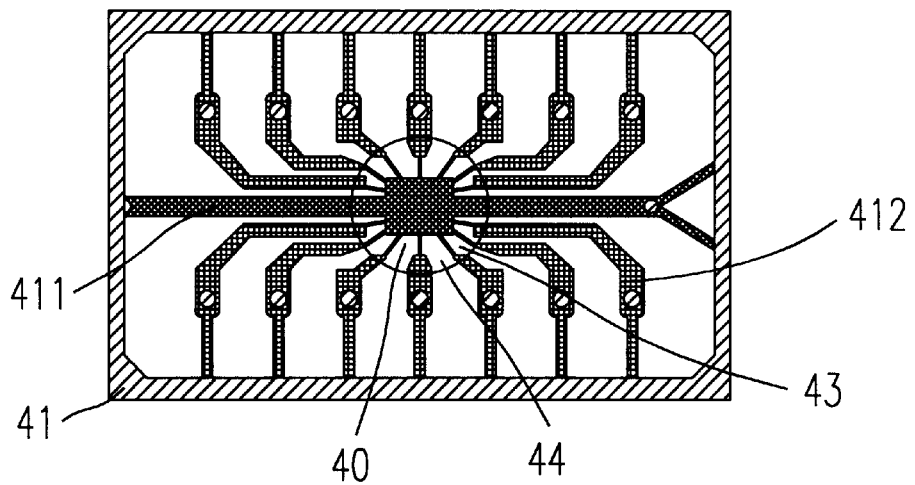
FIG. 4a shows a preferred embodiment of a method for packing a chip according to the present invention.
Figure 4B:
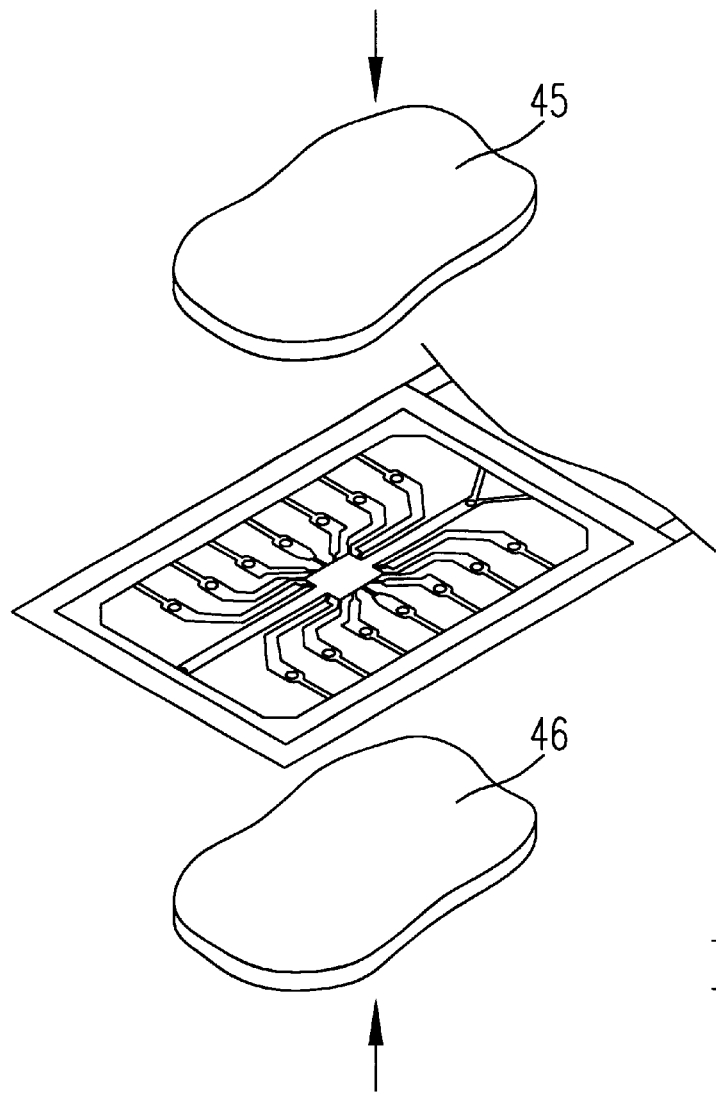
FIG. 4b shows a structure for packing IC according to the present invention.

Moreover, the same method is applied on the package of a chip. As FIG. 4(a) and FIG. 4(b) show the second preferred embodiment of the method of present invention for packing a chip. First of all, a chip (40) having a circuit thereon is put on a support (411) in the frame (41). Thereafter, a plurality of metal wires (43) is used to make an electrical connection between a plurality of pins in the electronic device (40) and a plurality of corresponding connectors in the frame (412). Then, a filling medium(44) is applied between the chip and the frame to form a semi-product. The fixing members (45), (46) are mounted on the chip to fix the chip with respect to the frame. The final process is to provide a mold enveloping the electronic device and the fixing member. Then, filling a packing medium into the mold, the fixing member and the packing medium are cured to form product.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for packing an electronic device comprising steps of:
   (a) puffing an electronic device having a plurality of pins on a support in a frame having a plurality of connecting members corresponding to said plurality of pins;
   (b) electrically connecting said plurality of pins of said electronic device with said corresponding connecting members;
   (c) attaching a preformed hardened adhering piece to at least one of the top surface and the bottom surface of said electronic device for fixing said electronic device with respect to said frame to form a semi-product; and
   (d) providing a molding tool enveloping said semi-product, introducing a packing medium into said molding tool, and curing said adhering piece and said packing medium simultaneously inside said molding tool, thereby forming a package body.

2. A method of claim 1, wherein said electronic device comprises a chip having circuits thereon.

3. A method of claim 1, wherein in said step (a), said plurality of pins are electrically connected to said corresponding connecting members by welding wires between said pins and said corresponding connecting members.

4. A method of claim 1, wherein before said step (b) further comprises a step of (b1) applying a filling medium between said electronic device and said frame.

5. A method of claim 1, wherein said step (c) further comprising a step of (c1) mounting another fixing member under said electronic device.

6. A method of claim 1, wherein in step (c), said adhering piece is made of a molding material.

* * * * *